United States Patent
Tian et al.

(10) Patent No.: US 10,390,040 B2
(45) Date of Patent: Aug. 20, 2019

(54) METHOD, APPARATUS, AND SYSTEM FOR DEEP FEATURE CODING AND DECODING

(71) Applicant: Peking University, Beijing (CN)

(72) Inventors: Yonghong Tian, Beijing (CN); Lin Ding, Beijing (CN); Tiejun Huang, Beijing (CN); Wen Gao, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 73 days.

(21) Appl. No.: 15/690,595

(22) Filed: Aug. 30, 2017

(65) Prior Publication Data

US 2018/0332301 A1 Nov. 15, 2018

(30) Foreign Application Priority Data

May 15, 2017 (CN) .......................... 2017 1 0338736

(51) Int. Cl.
*H04N 19/54* (2014.01)
*H04N 19/172* (2014.01)
*G06N 3/08* (2006.01)
*G06K 9/00* (2006.01)
*G06K 9/62* (2006.01)
*H04L 29/08* (2006.01)

(52) U.S. Cl.
CPC ......... *H04N 19/54* (2014.11); *G06K 9/00744* (2013.01); *G06K 9/6232* (2013.01); *G06N 3/08* (2013.01); *H04N 19/172* (2014.11); *G06K 9/6215* (2013.01); *G06K 9/6262* (2013.01); *H04L 67/10* (2013.01)

(58) Field of Classification Search
USPC .................................................. 375/240.08
See application file for complete search history.

(56) References Cited

U.S. PATENT DOCUMENTS

| | | | |
|---|---|---|---|
| 2006/0269162 A1* | 11/2006 | Chen ..................... | G06T 1/0028 |
| | | | 382/286 |
| 2013/0170541 A1* | 7/2013 | Pace ....................... | G06T 9/001 |
| | | | 375/240.02 |
| 2016/0234652 A1* | 8/2016 | Chao ..................... | H04W 4/043 |
| 2018/0114055 A1* | 4/2018 | Wang ................. | G06K 9/00268 |
| 2018/0176576 A1* | 6/2018 | Rippel ................. | H04N 19/126 |

* cited by examiner

*Primary Examiner* — Behrooz M Senfi
(74) *Attorney, Agent, or Firm* — Birch, Stewart, Kolasch & Birch, LLP

(57) ABSTRACT

Embodiments of the present disclosure provide a method, an apparatus, and a system for deep feature coding and decoding. The method comprises: extracting features of respective video frames; determining types of the features, the types reflecting time-domain correlation degrees between the features and a reference feature; encoding the features using predetermined coding patterns matching the types to obtain coded features; and transmitting the coded features to the server such that the server decodes the coded features for a vision analysis task. By using the embodiments of the present disclosure, videos per se may not be transmitted to the cloud server; instead, the features of the video, after being encoded, are transmitted to the cloud server for a vision analysis task; compared with the prior art, data transmission pressure may be lowered, and the storage pressure at the cloud server may also be lowered.

20 Claims, 5 Drawing Sheets

… (1)

METHOD, APPARATUS, AND SYSTEM FOR DEEP FEATURE CODING AND DECODING

FIELD

The present disclosure generally relates to video technologies, and more particularly to a method, an apparatus, and a system for deep feature coding and decoding.

BACKGROUND

In the rapidly developing network age, video information, as an accurate, efficient, and intuitive multimedia form, has been applied more and more widely.

One of important applications of video information is vision analysis. For example, by performing vision analysis to a monitored video, functions such as automatic alarm, object detection, and object tracking may be implemented; for another example, by vision analysis, a desired image may be retrieved from among mass videos.

In the prior art, a vision analysis task is generally performed at a cloud server, while videos to be subjected to vision analysis are always distributed over a plurality of terminals (e.g., monitoring terminals, etc.). The respective terminals usually need to transmit the videos acquired thereby to respective local servers at their localities which then transmit the videos to the cloud server for the vision analysis task.

However, in practical applications, a relatively large data amount of the videos transmitted to the cloud server will bring a relatively heavy pressure to data transmission as well as to storage at the cloud server.

SUMMARY

Embodiments of the present application provide a method, an apparatus, and a system for deep feature coding and decoding so as to solve the following technical problem in the prior art: the relatively large data amount of the videos transmitted to the cloud server for a vision analysis task will bring a relatively heavy pressure to data transmission as well as to storage at the cloud server.

In order to solve the technical problem above, embodiments of the present application are implemented as such:

An embodiment of the present application provides a method for deep feature coding and decoding, comprising:

extracting features of respective video frames;

determining types of the features, the types reflecting time-domain correlation degrees between the features and a reference feature;

encoding the features using predetermined coding patterns matching the types to obtain coded features; and transmitting the coded features to the server such that the server decodes the coded features for a vision analysis task.

Optionally, the extracting features of respective video frames specifically comprises:

receiving a video sequence acquired by one or more terminals;

extracting features of at least part of regions within the respective video frames included in the video sequence.

Optionally, the determining types of the features specifically comprises:

regarding each frame of the respective video frames as a current frame, respectively, and executing the following:

determining a reference feature for the feature of the current frame based on a feature of the reference frame in the respective video frames, which reference frame belongs to the same video sequence as the current frame, wherein frames in the video sequence are sorted according to time;

determining a type of the feature of the current frame based on the feature of the current frame and the reference feature for the feature of the current frame.

Optionally, the reference frame for the current frame is determined by sequentially referencing or adaptively referencing the frames in the video sequence to which the current frame belongs, the adaptive referencing being performed according to an inter-frame distance.

Optionally, the determining a type of the feature of the current frame based on the feature of the current frame and the reference feature for the feature of the current frame specifically comprises:

calculating a difference degree characterization value between the feature of the current frame and the reference feature for the feature of the current frame;

determining the type of the feature of the current frame according to the difference degree characterization value calculated.

Optionally, the coding pattern refers to at least one of:

independently encoding the feature of the current frame; encoding a residual between the feature of the current frame and its reference feature; using a coding result of the reference feature for the current frame as the coding result for the current frame.

Optionally, the encoding a residual between the feature of the current frame and its reference feature specifically comprises:

determining a residual coding mode matching the residual from among predetermined respective residual coding modes according to a rate accuracy-loss optimization model, coding loss degrees corresponding to the respective residual coding modes being different;

encoding the residual using the determined residual coding mode;

wherein the rate accuracy-loss optimization model is determined based on a loss function of an accuracy rate of a result of the vision analysis task, the loss function being determined based on the coding loss degree.

Optionally, the determining a residual coding mode matching the residual from among predetermined respective residual coding modes specifically comprises:

dividing the residual into a plurality of sub-vectors;

determining a residual coding mode matching a respective sub-vector from among the predetermined respective residual coding modes; and the encoding the residual using the determined residual coding mode specifically comprises:

encoding the residual by encoding the respective sub-vectors using the residual coding mode matching the respective sub-vector.

Optionally, the loss function is determined in an approach below:

determining, as a first probability distribution, a probability distribution of a distance between a to-be-encoded feature and a to-be-matched feature according to a specified probability distribution, wherein the to-be-matched feature is obtained based on a vision analysis task sample;

determining, as a second probability distribution, a probability distribution of a distance between the decoded feature corresponding to the to-be-encoded feature and the to-be-matched feature;

calculating an accuracy rate of a result when the vision analysis task is executed based on the feature before encoding and an accuracy rate of a result when the vision analysis task is executed based on the encoded and decoded feature according to the first probability distribution and the second probability distribution, respectively;

determining the loss function based on the accuracy rates of results calculated respectively.

Optionally, the encoding the features specifically comprises:

performing entropy coding to the features;

wherein the rate accuracy-loss optimization model is obtained according to the loss function and a code rate corresponding to the entropy coding.

Optionally, the method further comprises:

encoding auxiliary information and then transmitting the coded auxiliary information to the server, such that the server obtains the auxiliary information by decoding and decodes the coded features based on the auxiliary information;

wherein the auxiliary information includes at least one of the following: information representing the types of the features; information representing the reference feature.

optionally, after transmitting the coded features to the server, the method further comprises:

when receiving a request for acquiring video frames from the server, transmitting respective video frames corresponding to the request to the server.

Optionally, the features are deep learning features extracted through a deep learning network.

An embodiment of the present application provides an apparatus for deep feature coding and decoding, comprising:

an extracting module configured to extract features of respective video frames;

a determining module configured to determine types of the features, the types reflecting time-domain correlation degrees between the features and a reference feature;

an encoding module configured to encode the features using predetermined coding patterns matching the types to obtain coded features; and a transmitting module configured to transmit the coded features to the server such that the server decodes the coded features for a vision analysis task.

An embodiment of the present application provides a system for deep feature coding and decoding, comprising: one or more terminals, a local server, and a vision analysis server;

the one or more terminals transmit acquired video sequences to the local server;

the local server extract features of respective video frames included in the video sequence, determine types of the features, encodes the features using predetermined coding patterns matching the types to obtain coded features, and transmits the coded features to the vision analysis server, the types reflecting time-domain correlation degrees between the features and a reference feature;

the vision analysis server decodes the coded features for a vision analysis task.

Embodiments of the present application can achieve the following advantageous effects by adopting at least one of the technical solutions above: videos per se may not be transmitted to the cloud server; instead, the features of the video, after being encoded, are transmitted to the cloud server for a vision analysis task; compared with the prior art, data transmission pressure may be lowered, and the storage pressure at the cloud server may also be lowered, thereby partially or completely solving the problem in the prior art.

BRIEF DESCRIPTION OF THE DRAWINGS

In order to illustrate the embodiments of the present application or the technical solutions in the prior art more clearly, drawings that need to be employed in describing the embodiments or the prior art will be briefly introduced infra. It is apparent that the drawings described below are only some embodiments disclosed in the present application. To those of normal skill in the art, other drawings may also be derived based on these drawings without exercising inventive efforts.

DETAILED DESCRIPTION OF EMBODIMENTS

Embodiments of the present application provide a method and apparatus for deep feature coding and decoding.

To make those skilled in the art better understand the technical solutions in the present application, the technical solutions in the embodiments of the present application will be described in a clear and comprehensive way with reference to the drawings in the embodiments of the present application. It is apparent that the embodiments described herein are only part, not all of the embodiments. All other embodiments derived by those skilled in the art based on the embodiments in the present application without exercising inventive efforts should fall within the protection scope of the present application.

Machines have replaced human beings to analyze mass data and perform other vision tasks in many occasions. This process always does not need an entire video or image, but only needs features extracted based on video information. Specifically, the acquired videos may be subjected to feature extraction, feature coding, and transmission to a cloud server; the coded features are decoded at the cloud server, and then the decoded features may be used for a vision analysis task. The feature coding and transmitting scheme provided in the embodiments of the present application is an effective solution for mass data transmission of videos, which significantly lowers the costs of storage and transmission while ensuring the accuracy of the vision analysis task.

Figure 1:
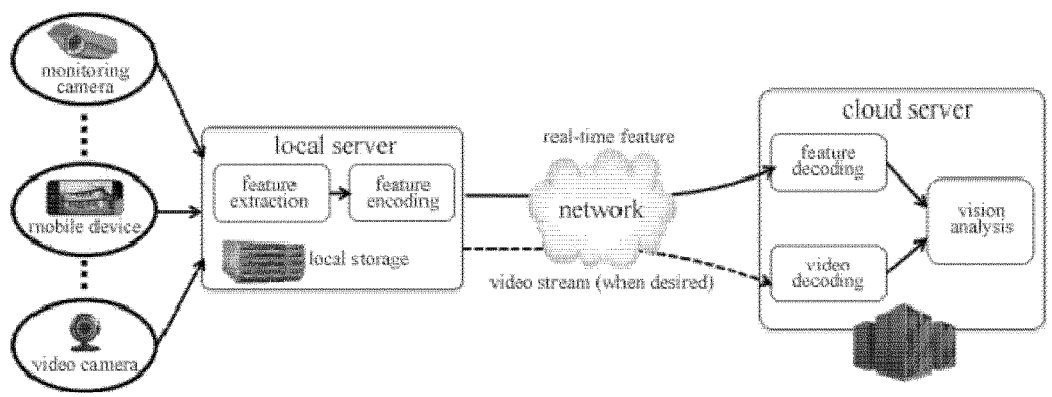
FIG. 1 is an overview diagram of a principle of a video feature coding and decoding solution provided by an embodiment of the present application in a practical application scenario.

FIG. 1 is an overview diagram of a principle of a video feature coding and decoding solution provided by an embodiment of the present application in a practical application scenario.

In FIG. 1, a large number of terminals (e.g., monitoring cameras, handheld mobile devise, etc.) transmit video sequences shot thereby to a local server at their localities; the local server stores locally the video sequences shot by the terminals, then performs feature extraction and feature coding to the video sequences, and transmits the bit streams of the coded features to a cloud server; the cloud server decodes the received bit streams for a vision analysis task. In some analysis applications, it is desired to further observe and analyze the results retrieved, and then transmit desired video contents (a small part of videos of interest) to the cloud server. Because the features are extracted on the original videos, higher quality features may guarantee the accuracy of the vision analysis task; compared with bit streams of the video sequences, the cost for transmitting the bit streams of the coded features is very small, which may alleviate the pressure for data transmission as well as the pressure for storage at the cloud server.

Further, in light of the fact that deep leaning features have gained good performance in many analysis tasks and facilitate enhancement of the performance of vision tasks such as image retrieval and object detection, embodiments of the present application further provide a deep learning feature-based coding and decoding scheme, specifically, encoding features using time-domain redundancy of the features, which lowers the code rate while maintaining the performance of the features.

Hereinafter, the solution will be described in detail.

Figure 2:
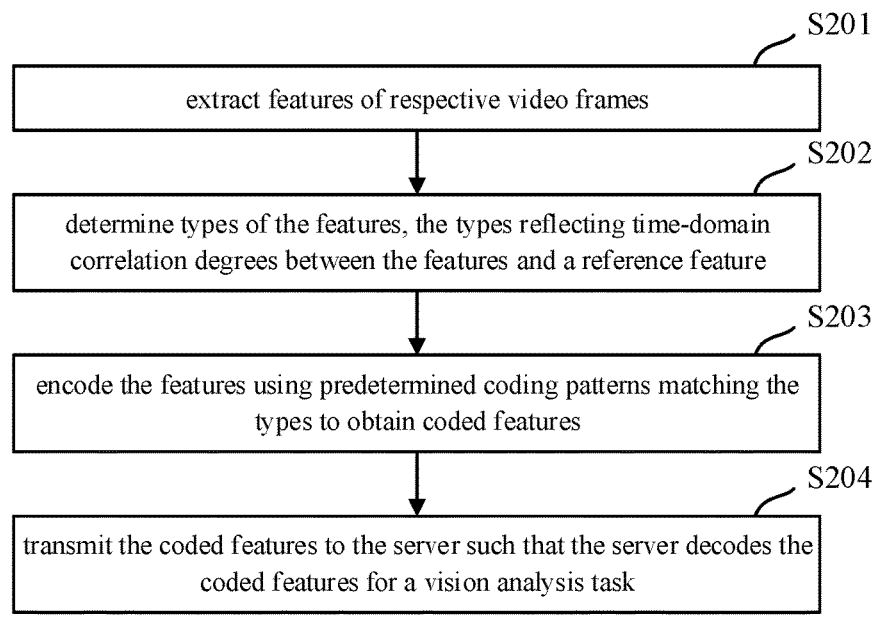
FIG. 2 is a flow diagram of a method for deep feature coding and decoding provided according to an embodiment of the present application.

FIG. 2 is a flow diagram of a method for deep feature coding and decoding provided according to an embodiment of the present application. An executing body of the flow may be a terminal and/or a server, e.g., the monitoring terminal and the local server as mentioned in the Background. The terminal and/or the server specifically may include, but not limited to, at least one of: a mobile phone, a tablet computer, a smart wearable device, a vehicle-carried device, a personal computer, a large or middle-sized computer, a computer cluster, etc.

The flow in FIG. 2 may comprise steps of:

S201: extracting features of respective video frames.

In an embodiment of the present application, respective video frames may be time-ordered. For example, the respective video frames may come from one or more video sequences. The features may be image features such as color, pattern, texture, greyscale, etc., and may also be deep learning features extracted through a deep learning network, preferably the latter, because the deep learning features are more beneficial to enhance an accuracy of the subsequent vision analysis task.

The present application does not limit data types of deep learning features, which, for example, may be real numbers or binary numbers; besides, the present application does not limit the specific structure of the deep learning network based on which the deep learning features are extracted.

S202: determining types of the features, the types reflecting time-domain correlation degrees between the features and a reference feature.

In an embodiment of the present application, the types are predefined. Different types reflect different time-domain correlation degrees between the features and the reference feature; the reference feature for the feature of any frame in respective video frames may be specifically obtained based on the following data: features of one or more frames other than the any frame in the respective video frames. For the convenience of description, the one or more frames may be referred to as a reference frame for the any frame.

The time-domain correlation degree may specifically refer to a time-domain redundancy degree or a similarity degree. Generally, for a feature of a respective video frame in the video sequence, the higher the time-domain correlation degree between the feature and the reference feature is, the higher the similarity degree between the feature and the reference feature is.

In an embodiment of the present application, the type of a feature may be determined based on a difference degree between the feature and the reference feature. The difference degree for example may be characterized by a characterization value such as a residual or a spatial distance.

S203: encoding the features using predetermined coding patterns matching the types to obtain coded features.

In an embodiment of the present application, if the time-domain correlation degree between a feature and the reference feature is high and the reference feature has been encoded, the feature may be encoded based on an encoding result of the reference feature, or the feature may be encoded based on a difference between the feature and the reference feature, which thus facilitates lowering the cost of feature encoding and reducing the data amount of the encoding result of the feature; if the time-domain correlation degree between the feature and the reference feature is relatively low, the feature may be encoded independently.

S204: transmitting the coded features to the server such that the server decodes the coded features for a vision analysis task.

In an embodiment of the present application, the server in step S204 for example may be the cloud server mentioned in the Background. Besides the coded feature, relevant auxiliary information may also be transmitted to the server so as to facilitate the server to decode. The auxiliary information may include information needed for decoding, e.g., types of the features, information about the reference feature, and the number of the features, etc.

In an embodiment of the present application, the vision analysis task includes, but not limited to, an image retrieval task and/or object detection and task tracking in a video, etc.

With the method of FIG. 2, the video per se is not required to be transmitted to the cloud server; instead, the features of the video, after being encoded, are transmitted to the cloud server for a vision analysis task; compared with the prior art, data transmission pressure may be lowered, and the storage pressure at the cloud server may also be lowered, thereby partially or completely solving the problem in the prior art.

Based on the method of FIG. 2, the embodiments of the present application also provide some specific implementation solutions and extended solutions of the method, which will be explained below.

In an embodiment of the present application, for the scene in the Background, the step S201 of extracting features of respective video frames specifically may comprise: receiving a video sequence acquired by one or more terminals; extracting features of at least part of regions within respective video frames included in the video sequence. The at least part of regions may be pre-extracted regions of interest, and the manners of extracting the regions of interest include: automatically extracting the regions of interest, manually marking the regions of interest, and combination of manual marking and automatic extraction. The forms of the regions of interest at least include one of the following data: an entire frame of an image, and partial image region of any size.

In an embodiment of the present application, as an example, the feature of the reference frame is directly used as the reference feature. Then, for step S302, the determining the types of the features specifically may comprise:

regarding each frame in the respective video frames as the current frame, and executing the current frame;

determining a reference feature for the feature of the current frame based on a feature of the reference frame in the respective video frames, which reference frame belongs to the same video sequence as the current frame, wherein frames in the video sequence are sorted according to time;

determining a type of the feature of the current frame based on the feature of the current frame and the reference feature for the feature of the current frame.

Further, there may be a plurality of manners to determine a reference frame for the current frame. For example, the reference frame for the current frame is determined by sequentially referencing or adaptively referencing the frames in the video sequence to which the current frame belongs, the adaptive referencing being performed according to an inter-frame distance. Particularly, the sequentially referencing specifically may refer to regarding one or more frames preceding the current frame as the reference frame for the current frame; the adaptive referencing may refer to determining, in a frame set consisting of a plurality of consecutive frames including the current frame, a frame, the sum of distances between the features of respective frames to the feature of which is the smallest according to inter-feature distances of respective frames, as the reference frame for the respective frames in the frame set, the feature of the reference frame being just the reference feature.

In an embodiment of the present application, the determining a type of the feature of the current frame based on the feature of the current frame and the reference feature for the feature of the current frame specifically may comprise: calculating a difference degree characterization value between the feature of the current frame and the reference feature for the feature of the current frame; determining the type of the feature of the current frame according to the difference degree characterization value calculated.

Further, the coding pattern may comprise at least one of: independently encoding the feature of the current frame (e.g., when the difference degree characterization value is relatively large); encoding a residual between the feature of the current frame and its reference feature (e.g., when the difference degree characterization value is moderate); using a coding result of the reference feature for the current frame as the coding result for the current frame (e.g., when the difference degree characterization value is relatively small).

Figure 3:
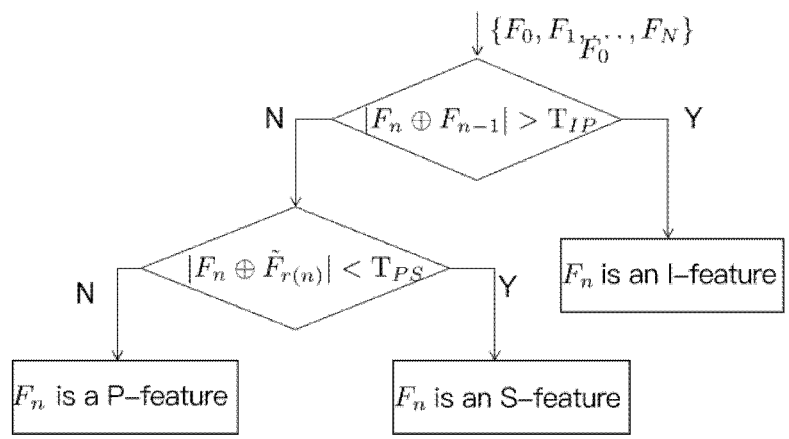
FIG. 3 is a schematic diagram of a specific implementation scheme adopted for determining a type of a feature of the current frame in a practical application scenario provided according to an embodiment of the present application.

To facilitate understanding, an embodiment of the present application provides a schematic diagram of a specific implementation scheme adopted for determining a type of a feature of the current frame in a practical application scenario provided according to an embodiment of the present application, as shown in FIG. 3.

In the scenario of FIG. 3, the $n^{th}$ frame of the video sequence is defined as $I_n$, n=1, 2, . . . , N, where N denotes the total number of frames. A region of interest is extracted through a specified region-of-interest extraction algorithm. Particularly, one or more regions of interest may exist in each frame; generally, the region of interest may be a region where a moving object like a person or a vehicle in the video sequence.

Each region of interest is subjected to deep feature extraction; the extracted deep learning feature is represented as $F_{n,m}$, n=1, 2, . . . , N; m=1, 2, . . . , $M_n$, where $M_n$ denotes the number of regions of interest in the $n^{th}$ frame.

As an example, one frame only has one deep feature that is a binary feature; according to such a deep feature encoding approach, the deep learning feature of the $n^{th}$ frame is $F_n$.

As mentioned above, feature types may be determined based on a time-domain correlation degree between the features and a reference feature, each feature type adopting a different coding pattern. The number of feature types is at least one, considering the number of bits needed for feature type encoding and actual situations. In the scenario of FIG. 3, the approach adopted by determining feature types is: dividing the feature types into three categories, respectively named as I-feature, P-feature, and S-feature. Decision of a feature type adopt two predetermined thresholds ($T_{IP}$, $T_{IS}$, and $T_{IP}>T_{IS}$) based on a similarity degree between the current feature and the reference feature (specifically characterized by an inter-feature distance).

The feature of the current frame is defined as $F_n$ (referred to as the current feature), the reference feature for $F_n$ is $\tilde{F}_{r(n)}$, the preceding feature of $F_n$ is $F_{n-1}$. Supposing the reference feature is determined using a sequential referencing approach, the preceding feature $F_{n-1}$ of $F_n$ is the reference feature $\tilde{F}_{r(n)}$ of $F_n$.

When the difference between the current feature $F_n$ and the reference feature $\tilde{F}_{r(n)}$ is relatively large, i.e., when the distance between the current feature and the reference feature is greater than a threshold $T_{IP}$, it is determined that the type of the current feature is I-feature; then the current feature may be independently encoded; the I-feature may provide a high quality reference for encoding subsequent features and meanwhile may provide a random access capability; when the difference between the current feature and the reference feature is relatively small, i.e., when the distance between the current feature and the reference feature is smaller than a threshold $T_{IS}$, it is determined that the type of the current feature is S-feature; at this point, it is not needed to encode the current feature, and the coding result of the current feature is directly represented by the coding result of the reference feature; for other situations, it is regarded that a certain degree of scenario change occurs, and the type of the current feature is determined as P-feature; at this point, it is needed to encode the residual $F_n \oplus \tilde{F}_{r(n)}$ between the current feature and the reference feature.

The inter-feature distance may include, but not limited to, a Hamming distance, a Euclidean distance, and a transformation of the distances above. For example, the distance between the current feature and the reference feature may be denoted by $|F_n \oplus \tilde{F}_{r(n)}|$ and/or $|F_n \oplus F_{n-1}|$. In FIG. 3, with $|F_n \oplus F_{n-1}|>T_{IP}$ as a condition for the determining, it is first determined whether the type of $F_n$ is I-feature; if not, with $|F_n \oplus \tilde{F}_{r(n)}|<T_{PS}$ a condition for the determining, it is further determined whether the type of $F_n$ is P-feature or S-feature. It needs to be noted that in an actual application, FIG. 3 only shows an example instead of a limitation of the sequence of determining and the conditions of determining; and in an actual application, the sequence of determining and the condition of determining in FIG. 3 may be modified as required. In addition, besides the inter-feature distance, other characteristic values characterizing the inter-feature difference degree may be used in the determining process.

Figure 4:
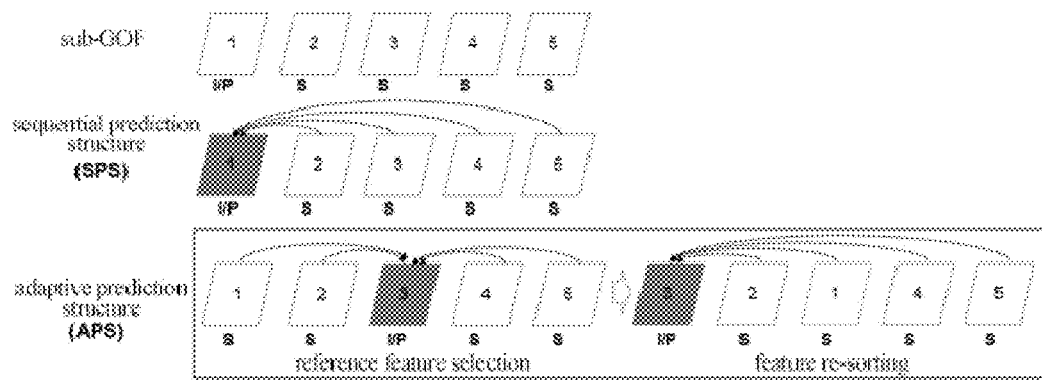
FIG. 4 is a schematic diagram of principles of two referencing manners available for determining a reference feature provided according to an embodiment of the present application.

Further, an embodiment of the present application also provides a schematic diagram of principles of two referencing manners available for determining a reference feature (i.e., determining a reference feature), as shown in FIG. 4. Suppose the features of respective video frames are sorted corresponding to the sequence of the respective video frames in the video sequence.

Features between two neighboring I-features and the first I-feature in the two neighboring I-features are defined as: a group of features (GOF); the features between two I-features/P-features and the first I/P-feature in the two I-features/P-features are defined as: a sub-group of features (sub-GOF), one sub-GOF only comprising one I/P-feature, denoted as $\{F_{i1}, F_{i2}, \ldots, F_{i,J}\}$; the two referencing manners have respective corresponding reference structures:

The first kind of reference structure is a sequential prediction structure (SPS). In the SPS, the first feature in $\{F_{i1}, F_{i2}, \ldots, F_{i,J}\}$ is encoded as an I/P-feature, while the subsequent other features are all S-features and directly represented by the first feature. However, for the S-features in the sub-GOF, the first feature is possibly not an optimal selection for the reference feature.

The second kind of structure is an adaptive prediction structure (APS). The APS adaptively selects a better reference feature from among $(F_{i1}, F_{i2}, \ldots, F_{i,J})$. In the APS, the distances between any feature $F_{ik}$ and other features in the sub-set (with the Hamming distance as an example, but not limited to the Hamming distance) are defined as a group of distances $D_{group}(k)$, then $$D_{group}(k) = \Sigma_{j=0}^{J} |F_{ik} \oplus F_{ij}|, k=0,1,\ldots,J$$

A feature with the smallest group of distances is selected as the reference feature. For the sake of no decoding delay, the feature is adjusted to the first feature in the sub-GOF and encoded as I/P-feature. Other features in the sub-GOF are represented by the feature.

Further, for the P-feature, an embodiment of the present application further provides a residual encoding approach. Specifically, the encoding a residual between the current feature and its reference feature specifically may comprise: determining a residual coding mode matching the residual from among predetermined respective residual coding modes according to a rate accuracy-loss optimization model, coding loss degrees corresponding to the respective residual coding modes being different; encoding the residual using the determined residual coding mode; wherein the rate accuracy-loss optimization model is determined based on a loss function of an accuracy rate of a result of the vision analysis task, the loss function being determined based on the coding loss degree.

An entirety of each residual may only be matched to one residual coding mode, and a plurality of parts of the entirety of each residual may be matched to different residual coding modes, respectively. With the latter as an example, the determining a residual coding mode matching the residual from among predetermined respective residual coding modes specifically comprises: dividing the residual into a plurality of sub-vectors; determining a residual coding mode matching a respective sub-vector from among the predetermined respective residual coding modes; and the encoding the residual using the determined residual coding mode specifically comprises: encoding the residual by encoding a corresponding sub-vector using the residual coding mode matching the respective sub-vector. For the convenience of understanding, FIG. 5 will be referenced to illustrate.

Figure 5:
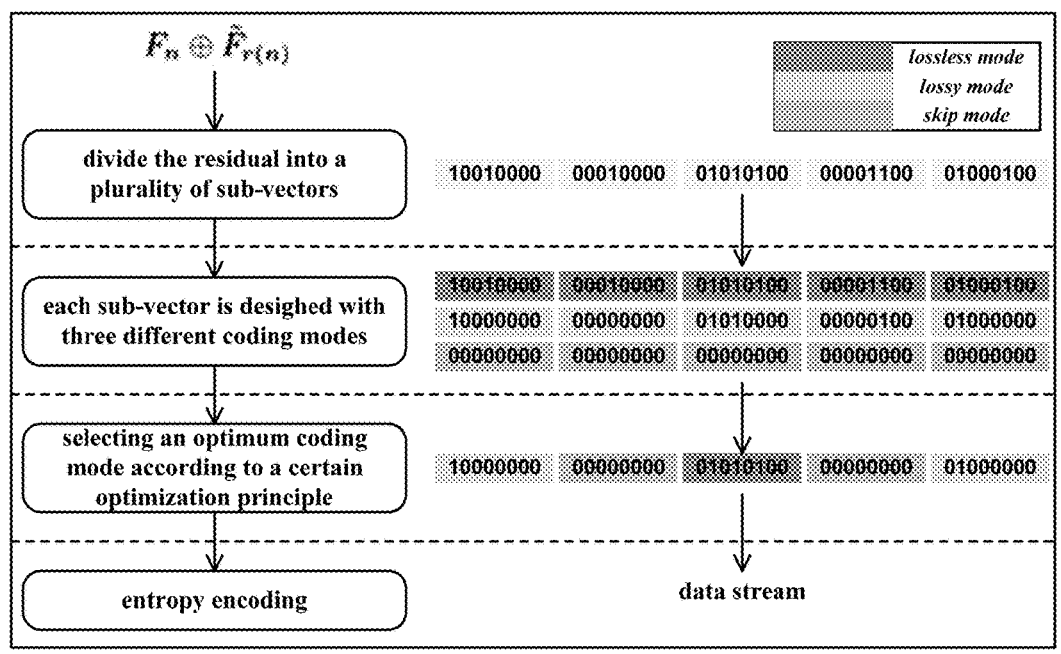
FIG. 5 is a flow diagram of residual coding in a practical application scenario provided according to an embodiment of the present application.

FIG. 5 is a flow diagram of residual encoding in a practical application scenario provided according to an embodiment of the present application.

In FIG. 5, the residual is represented by vectors. The residual vector $C_{n,\bar{r}(n)}$ is divided into S sub-vectors of equal length: $\{C_{n,\bar{r}(n)}^{s}\}_{s=1}^{S} \in C_{n,\bar{r}(n)}$, and then a different matching residual coding mode is designed for a respective sub-vector. As an example, there are three residual coding modes in total, i.e., directly encoding the original residual (lossless mode), subjecting the sub-vector to a certain extent of loss (lossy mode), and encoding a zero sub-vector (skip mode). For each $C_{n,\bar{r}(n)}^{s}$, different code rates and losses may be obtained from the three modes, respectively. Based on a rate accuracy-loss optimization model, an optimum mode may be selected.

The rate accuracy-loss optimization model proposed in the present application will be further explained. The loss function may be determined according to the approach below: determining, as a first probability distribution, a probability distribution of a distance between a to-be-encoded feature and a to-be-matched feature according to a specified probability distribution, wherein the to-be-matched feature is obtained based on a vision analysis task sample; determining, as a second probability distribution, a probability distribution of a distance between the decoded feature corresponding to the to-be-encoded feature and the to-be-matched feature; calculating an accuracy rate of a result when the vision analysis task is executed based on the feature before encoding and an accuracy rate of a result when the vision analysis task is executed based on the encoded and decoded feature according to the first probability distribution and the second probability distribution, respectively; determining the loss function based on the accuracy rates of results calculated respectively.

The vision analysis task samples may be provided by the cloud server or obtained by the local server through other approaches. The vision analysis task samples may preferably have a certain commonness in the scenes with the vision analysis task to be subsequently executed by the cloud server; as such, the vision analysis task sample has a higher reference value, facilitating improvement of the reliability of the rate accuracy-loss optimization model.

For step S203, either lossless encoding or lossy encoding may be adopted when encoding the features. Entropy coding is just a lossless encoding. In this case, encoding the features may specifically comprise: performing entropy coding to the features (the specific encoding content depends on determination of the feature types); wherein the rate accuracy-loss optimization model is obtained based on the loss function and the coding rate corresponding to the entropy coding. The entropy coding specifically may adopt a context-adaptive binary arithmetic coding (CABAC) algorithm or other similar algorithm in High Efficiency Video Coding (HEVC).

More specifically, the rate accuracy-loss optimization model may be obtained by comprehensively considering the loss calculated based on a loss function of the accuracy rate of vision analysis task and the code rate, wherein the loss function of the accuracy rate of the vision analysis task is obtained by calculating a distortion between the coded feature and the original feature.

For example, the rate accuracy-loss optimization model may be specifically defined as follows:

$$\min_{\Phi} J = L(D) + \lambda \cdot R;$$

where R denotes a code rate of entropy coding; λ denotes a weight for controlling balancing between code rate and inaccuracy. When λ is relatively large, the encoding prefers saving the code rate, but the loss will be larger. Φ denotes the designed residual coding modes, and J denotes a rate accuracy-loss cost; in this way, in the rate accuracy-loss optimization model, the residual coding mode with the minimum rate accuracy-loss cost will be selected as an optimum mode. L(D) denotes a loss function of the accuracy rate of the vision analysis task, and D denotes a distortion between the coded feature and the original feature, where D may be in one or more of the following forms: a standard deviation (SAD), a mean square error (MSE), and a root-mean-square error (RMSE), etc. The loss function L(D) of the accuracy rate of the vision analysis task is obtained by calculating D. With the vision analysis task being a search task as an example, possible specific steps of calculating the loss function L(D) are provided below:

modelling a probability distribution of a Hamming distance between the original feature and the to-be-matched feature using generalized binomial distribution;

resolving, based on priori probability, the probability distribution of the Hamming distance between the decoded feature corresponding to the original feature and the to-be-matched feature in the case of coding loss D;

resolving a search accuracy rate of the original feature and a search accuracy rate with coding loss based on the distribution and a marking of the search task;

making L(D) proportional to the accuracy loss.

Compared with a rate distortion optimization model (RDO) in video encoding, L(D) in the rate accuracy-loss optimization model may better weigh the accuracy loss of a feature in the vision analysis task, such that a better analysis accuracy rate may be achieved at the same code rate.

For a scenario where a plurality of regions of interest (a plurality of features) exist in one frame, the multi-feature coding issue may be converted into a single-feature coding issue based on a referencing relationship.

In an embodiment of the present application, the flow in FIG. 2 may also comprise executing of: encoding auxiliary information and then transmitting the coded auxiliary information to the server, such that the server obtains the auxiliary information by decoding and decodes the coded features based on the auxiliary information; wherein the auxiliary information includes at least one of the following: information representing the types of the features; information representing the reference feature. The auxiliary information may also include more contents, e.g., width of the region of interest, height of the region of interest, coordinates information of the region of interest in an image, properties of an object in the region of interest, event information in the region of interest, etc.

In an embodiment of the present application, the auxiliary information is firstly decoded at a decoding end (e.g., the server in step S204). From the decoding, the types of features, the amount of the features, and the reference feature information and the like, which are needed by decoding the deep learning feature, may be obtained for decoding the coded feature. Features satisfying different application needs may be reconstructed; after the features are obtained through decoding, a feature sequence may be rebuilt for subsequent tasks such as vision analysis.

In an embodiment of the present application, as mentioned above, in some cases, the cloud server possibly cannot accurately execute the vision analysis task only based on the features. In this case, it may be further requested to invoke the corresponding video frames. Then, for step S204, after transmitting the coded features to the server, the method further comprises: when receiving a request for acquiring video frames from the user, transmitting respective video frames corresponding to the request to the server.

Figure 6:
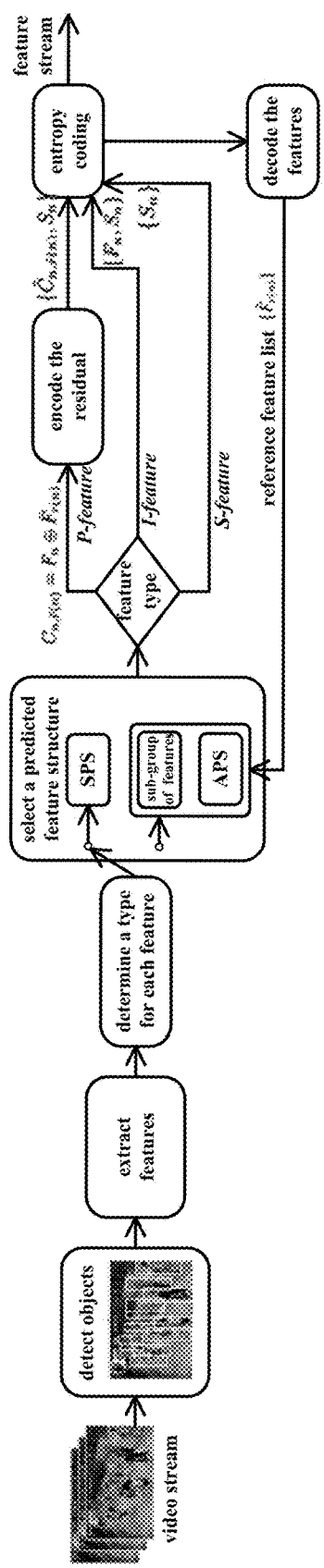
FIG. 6 is a flow diagram of a feature coding and decoding solution based on a deep learning feature in a practical application scenario provided according to an embodiment of the present application.

According to the description above, an embodiment of the present disclosure also provides a flow diagram of a feature coding and decoding solution based on a deep learning feature in a practical application scenario provided according to an embodiment of the present application, as shown in FIG. 6.

The flow of FIG. 6 mainly may comprise steps of:

Step 1: extracting regions of interest for each frame of a video sequence.

Step 2: extracting a deep feature of each region of interest.

Step 3: selecting a reference feature for a current feature.

Step 4: determining a feature type for the current feature based on a time-domain correlation degree between the current feature and the reference feature.

Step 5: encoding based on the feature type. For a feature that requires encoding a residual, encoding of the residual first divides a residual vector into a plurality of sub-vectors of equal length, wherein each sub-vector will have a different mode, and finally selecting an optimum mode based on a rate accuracy-loss optimization model.

Step 6: encoding auxiliary information, wherein the auxiliary information includes reference feature information, the number of features in one frame, and feature types, etc., which are essential for feature decoding.

Step 7: during the decoding process, the auxiliary information is firstly decoded, from which the feature types, the number of features, and reference feature information and etc. which are essential for decoding the deep feature, may be obtained.

Step 8: decoding the feature content based on auxiliary information.

Step 9: if the residual of the feature is obtained from the decoding, it is needed to reconstruct the current feature based on the reference feature and then reconstruct a feature sequence.

What have been discussed above is a method for deep feature coding and decoding provided according to the embodiments of the present application. Based on the same inventive concept, embodiments of the present application further provide a corresponding apparatus and system, as illustrated in FIGS. 7 and 8.

Figure 7:
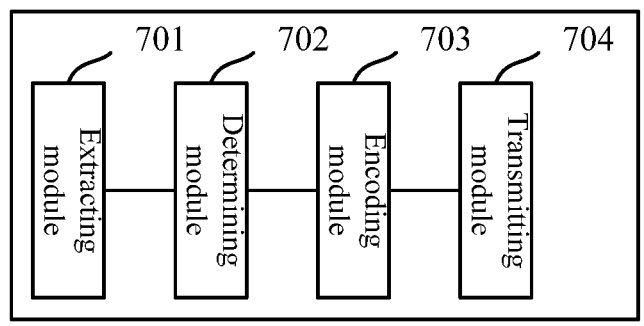
FIG. 7 is a structural diagram of an apparatus for deep feature coding and decoding corresponding to FIG. 2 provided according to an embodiment of the present application.
Figure 8:
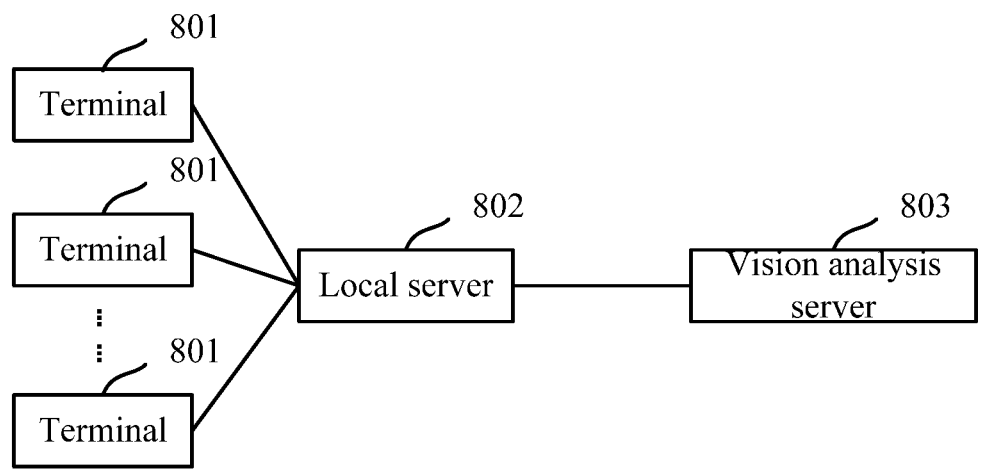
FIG. 8 is structural diagram of a system for deep feature coding and decoding corresponding to FIG. 2 provided according to an embodiment of the present application.

FIG. 7 is a structural diagram of an apparatus for deep feature coding and decoding corresponding to FIG. 2 provided according to an embodiment of the present application, which apparatus may be located on an executing body of the flow of FIG. 2, comprising:

an extracting module 701 configured to extract features of respective video frames;

a determining module 702 configured to determine types of the features, the types reflecting time-domain correlation degrees between the features and a reference feature;

an encoding module 703 configured to encode the features using predetermined coding patterns matching the types to obtain coded features; and a transmitting module 704 configured to transmit the coded features to the server such that the server decodes the coded features for a vision analysis task.

FIG. 8 is structural diagram of a system for deep feature coding and decoding corresponding to FIG. 2 provided according to an embodiment of the present application. one or more terminals 801, a local server 802, and a vision analysis server 803;

the one or more terminals 801 transmit acquired video sequences to the local server 802;

the local server 802 extracts features of respective video frames included in the video sequence, determine types of the features, encodes the features using predetermined coding patterns matching the types to obtain coded features, and transmits the coded features to the vision analysis server

803, the types reflecting time-domain correlation degrees between the features and a reference feature;

the vision analysis server 803 decodes the coded features for a vision analysis task.

The apparatus and system provided in the embodiments of the present application correspond to the method. Therefore, the apparatus and system also have similar advantageous effects to the corresponding method. Because the advantageous effects of the method have been mentioned above, the advantageous effects of the corresponding apparatus and system will not be detailed here.

In 1990s, improvement of a technology could be distinctly differentiated into hardware improvement (e.g., improvements on circuit structures like diode, transistor, switch, etc.) or software improvement (i.e., improvement of a method flow). However, with the development of technologies, improvement of many method flows currently may be regarded as a direct improvement of the hardware circuit structure. Almost all designers will program an improved method flow into a hardware circuit to obtain a corresponding hardware circuit structure. Therefore, it is improper to deem that improvement of method flow cannot be implemented by hardware entity modules. For example, a programmable logic device (PLD, e.g., a Field Programmable Gate Array (FPGA), etc.) is just such an integrated circuit, whose logic function is determined by the user's programming of the device. A design may autonomously program to "integrate" a digital system on a PLD, without needing to invite a chip manufacturer to design and fabricate a specific integrated circuit chip. Moreover, currently, instead of manually fabricating an integrated circuit chip, this programming mostly turns to a "logic compiler" to implement, which is similar to a software compiler used when developing and writing a program, while the original code before encoding is also written in a specific programming language referred to as a Hardware Description Language (HDL); however, there is not only one kind of HDL; instead, there are a lot of kinds of HDL, e.g., ABEL (Advanced Boolean Expression Language), AHDL (Altera Hardware Description Language), Confluence, CUPL (Cornell University Programming Language), HDCal, JHDL (Java Hardware Description Language), Lava, Lola, MyHDL, PALASM, RHDL (Ruby Hardware Description Language), etc. Currently, the most popular ones are VDL (Very-High-Speed Integrated Circuit Hardware Description Language) and Verilog. Those skilled in the art should also be clear that only by subjecting a method flow to a little logic programming using the hardware descriptive languages and programming it into the integrated circuit, a hardware circuit for implementing the logic method flow will be easily obtained.

The controller may be implemented in any appropriate manner. For example, the controller may adopt a form of for example a microprocessor or a processor, a computer readable medium that stores computer-readable program codes (e.g., software or firmware) executable by the (micro) processor, a logic gate, a switch, an application specific integrated circuit (ASIC), a programmable logic controller, and an embedded microcontroller, etc., examples of the controller include, but not limited to, the following microcontrollers: ARC 625D, Atmel AT91SAM, Microchip PIC18F26K20 and Silicone Labs C8051F320; the memory controller may also be implemented as part of the control logic of the memory. Those skilled in the art know also that besides implementing the controller in a pure computer-readable program code, the method steps may be subjected to logic programming to cause the controller to implement the same functions in the form of a logic gate, a switch, an application specific integrated circuit, a programmable logic controller, and an embedded microcontroller, etc. Therefore, such controller may be regarded as a hardware component, while the modules included therein for implementing various functions may also be regarded as a structure within the hardware component. Or, the modules for implementing various functions may be even regarded as software modules for implementing the method or the structure within the hardware component.

The system, apparatus, modules or units illustrated in the embodiments may be specifically implemented by a computer chip or entity or by a product having certain functions. A typical implementation device may be a computer. Specifically, the computer for example may be a personal computer, a laptop computer, a cellular phone, a camera phone, a smart phone, a personal digital assistant, a media player, a navigation device, an email device, a game console, a tablet computer, a wearable device, or a combination of any of these devices.

For the convenience of description, the apparatus above is divided into various units by functions so as to be described separately. Of course, the functions of various units may be implemented in a same or a plurality of software and/or hardware when implementing the present application.

Those skilled in the art should understand that the embodiments of the present invention may be provided as a method, a system, or a computer program product. Therefore, the present invention may adopt a full hardware embodiment, a full software embodiment, or an embodiment combining software and hardware aspects. Moreover, the present invention may adopt a form of a computer program product implemented on one or more computer available storage mediums (including, but not limited to, a magnetic disk memory, a CD-ROM, an optical memory, etc.) with computer-usable program codes embodied thereon.

The present disclosure is described with reference to the flow diagrams and/or block diagrams of the method, apparatus (system), and computer program product according to the embodiments of the present disclosure. It should be understood that each procedure and/or block in the flow diagrams and/or block diagrams, and a combination of the procedures and/or blocks in the flow diagrams and/or block diagrams, may be implemented by computer program instructions. These computer program instructions may be provided to a general computer, a specific computer, an embedded processor or a processor of any other programmable data processing device to generate a machine, so as to generate, through the instructions executed by the computer or the processor of other programmable data processing device, an apparatus for implementing functions specified in one or more procedures of a flow diagram and/or functions specified in one or more block or blocks in block diagrams.

These computer program instructions may also be stored in a computer-readable memory that can boot a computer or other programmable data processing device to work in a specific manner, such that the instructions stored in the computer readable memory generate a product including an instruction module, the instruction module implementing functions specified in one or more procedures of a flow diagram and/or functions specified in one or more block or blocks in block diagrams.

These computer program instructions may also be loaded on a computer or other programmable data processing device, such that a series of operating steps are executed on the computer or other programmable device to generate a computer-implemented processing; consequently, the instructions executed on the computer or other programmable device provide steps for implementing functions specified in one or more procedures of a flow diagram and/or functions specified in one or more block or blocks in block diagrams.

In a typical configuration, the computing device comprises one or more processors (CPU), input/output interfaces, network interfaces, and a memory.

The memory possibly includes a non-volatile memory in a computer-readable medium, a random-access memory (RAM) and/or a non-volatile memory, etc., e.g., a read-only memory (ROM) or a flash RAM. The memory is an example of the computer-readable medium.

The computer-readable medium includes permanent or nonpermanent, mobile and immobile mediums, which may implement information storage by any method or technology. The information may refer to a computer-readable instruction, a data structure, a program module or other data. Examples of the storage medium of the computer include, but not limited to, a phase change RAM, a static random access memory (SRAM), a dynamic random access memory (DRAM), other types of random access memory (RAM), read-only memory (ROM), an electrically erasable programmable read-only memory (EEPROM), a flash memory body or other memory technology, a compact disc read-only memory (CD-ROM), a digital versatile disc (DVD) or other optical storage, cassette magnetic tape, disk or tape storage or other magnetic storage device, or any other non-transmission medium, available for storing information that is accessible to the computing device. According to the definition herein, the computer-readable medium does not include a transitory medium, e.g., a modulated data signal and carrier.

It should also be noted that the terms "comprise," "include" or any other variables intend to cover a non-exclusive inclusion, such that a process, method, product or apparatus including a series of elements not only include those elements, but also include other elements that are not explicitly listed, or the elements inherent for such a process, method, product or apparatus. Without more limitations, an element limited by the expression "including a(n) . . . " does not exclude other identical elements present in the process, method, product or apparatus including the element.

The present application may be described in a general context of computer-executable instructions executed by a computer, e.g., a program module. Generally, the program module includes a routine, a program, an object, a component, a data structure, etc., for executing a specific task or implementing a specific abstract data type. The present application may also be practiced in a distributed computing environment. In these distributed computing environments, the task is executed by a remote processing device connected via a communication network. In the distributed computing environment, the program module may also be located in a local or remote computer storage medium including a storage device.

Various embodiments in the specification are all described in a progressive manner. Same or similar components between the various embodiments may be referred to each other. Each embodiment focuses on differences from other embodiments. Particularly, for a system embodiment, because it is basically similar to the method embodiment, it is described relatively simply. Relevant parts may refer to part of illustrations of the method embodiments.

The embodiments discussed above are only illustrative, not for limiting the present application. To those skilled in the art, the present application may be subject to various alterations and changes. Any modifications, equivalent substitutions, and improvements made within the spirit and principle of the present application should be included within the scope of the claims of the present application.

We claim:

1. A method for deep feature coding and decoding, comprising:
    extracting features of respective video frames;
    determining types of the features, the types reflecting time-domain correlation degrees between the features and a reference feature;
    encoding the features using predetermined coding patterns matching the types to obtain coded features; wherein, encoding the features further comprises, determining the degree of coding loss corresponding to feature coding according to a vision analysis task; and
    transmitting the coded features to the server such that the server decodes the coded features for the vision analysis task.

2. The method according to claim 1, wherein the extracting features of respective video frames specifically comprises:
    receiving a video sequence acquired by one or more terminals;
    extracting features of at least part of regions within the respective video frames included in the video sequence.

3. The method according to claim 1, wherein the determining types of the features specifically comprises:
    regarding each frame of the respective video frames as a current frame, respectively, and executing the following:
        determining a reference feature for the feature of the current frame based on a feature of the reference frame in the respective video frames, which reference frame belongs to the same video sequence as the current frame, wherein frames in the video sequence are sorted according to time; and
        determining a type of the feature of the current frame based on the feature of the current frame and the reference feature for the feature of the current frame.

4. The method according to claim 3, wherein the reference frame for the current frame is determined by sequentially referencing or adaptively referencing the frames in the video sequence to which the current frame belongs, the adaptive referencing being performed according to an inter-frame distance.

5. The method according to claim 3, wherein the determining a type of the feature of the current frame based on the feature of the current frame and the reference feature for the feature of the current frame specifically comprises:
    calculating a difference degree characterization value between the feature of the current frame and the reference feature for the feature of the current frame;
    determining the type of the feature of the current frame according to the difference degree characterization value calculated.

6. The method according to claim 3, wherein the coding pattern refers to at least one of:
    independently encoding the feature of the current frame; encoding a residual between the feature of the current frame and its reference feature; using a coding result of the reference feature for the current frame as the coding result for the current frame.

7. A method for deep feature coding and decoding, comprising:
    extracting features of respective video frames;

determining types of the features, the types reflecting time-domain correlation degrees between the features and a reference feature;

encoding the features using predetermined coding patterns matching the types to obtain coded features; and transmitting the coded features to the server such that the server decodes the coded features for a vision analysis task;

wherein the determining types of the features specifically comprises:

regarding each frame of the respective video frames as a current frame, respectively, and executing the following:

determining a reference feature for the feature of the current frame based on a feature of the reference frame in the respective video frames, which reference frame belongs to the same video sequence as the current frame, wherein frames in the video sequence are sorted according to time; and determining a type of the feature of the current frame based on the feature of the current frame and the reference feature for the feature of the current frame;

wherein the coding pattern refers to at least one of:

independently encoding the feature of the current frame; encoding a residual between the feature of the current frame and its reference feature; using a coding result of the reference feature for the current frame as the coding result for the current frame;

wherein the encoding a residual between the feature of the current frame and its reference feature specifically comprises:

determining a residual coding mode matching the residual from among predetermined respective residual coding modes according to a rate accuracy-loss optimization model, coding loss degrees corresponding to the respective residual coding modes being different;

encoding the residual using the determined residual coding mode;

wherein the rate accuracy-loss optimization model is determined based on a loss function of an accuracy rate of a result of the vision analysis task, the loss function being determined based on the coding loss degree.

8. The method according to claim 7, wherein the determining a residual coding mode matching the residual from among predetermined respective residual coding modes specifically comprises:

dividing the residual into a plurality of sub-vectors;

determining a residual coding mode matching a respective sub-vector from among the predetermined respective residual coding modes; and the encoding the residual using the determined residual coding mode specifically comprises:

encoding the residual by encoding the respective sub-vectors using the residual coding mode matching the respective sub-vector.

9. The method according to claim 7, wherein the loss function is determined in an approach below:

determining, as a first probability distribution, a probability distribution of a distance between a to-be-encoded feature and a to-be-matched feature according to a specified probability distribution, wherein the to-be-matched feature is obtained based on a vision analysis task sample;

determining, as a second probability distribution, a probability distribution of a distance between the decoded feature corresponding to the to-be-encoded feature and the to-be-matched feature;

calculating an accuracy rate of a result when the vision analysis task is executed based on the feature before encoding and an accuracy rate of a result when the vision analysis task is executed based on the encoded and decoded feature according to the first probability distribution and the second probability distribution, respectively;

determining the loss function based on the accuracy rates of results calculated respectively.

10. The method according to claim 7, wherein the encoding the features specifically comprises:

performing entropy coding to the features;

wherein the rate accuracy-loss optimization model is obtained according to the loss function and a code rate corresponding to the entropy coding.

11. The method according to claim 3, wherein the method further comprises:

encoding auxiliary information and then transmitting the coded auxiliary information to the server, such that the server obtains the auxiliary information by decoding and decodes the coded features based on the auxiliary information;

wherein the auxiliary information includes at least one of the following: information representing the types of the features; information representing the reference feature.

12. The method according to claim 3, wherein after transmitting the coded features to the server, the method further comprises:

when receiving a request for acquiring video frames from the server, transmitting respective video frames corresponding to the request to the server.

13. The method according to claim 1, wherein the features are deep learning features extracted through a deep learning network.

14. An apparatus for deep feature coding and decoding, comprising:

an extracting module configured to extract features of respective video frames;

a determining module configured to determine types of the features, the types reflecting time-domain correlation degrees between the features and a reference feature;

an encoding module configured to encode the features using predetermined coding patterns matching the types to obtain coded features; wherein, the encoding module further configured to determine the degree of coding loss corresponding to feature coding according to a vision analysis task; and a transmitting module configured to transmit the coded features to the server such that the server decodes the coded features for the vision analysis task.

15. A system for deep feature coding and decoding for executing the method according to claim 1, comprising: one or more terminals, a local server, and a vision analysis server;

the one or more terminals transmit acquired video sequences to the local server;

the local server extracts features of respective video frames included in the video sequence, determine types of the features, encodes the features using predetermined coding patterns matching the types to obtain coded features, and transmits the coded features to the vision analysis server, the types reflecting time-domain correlation degrees between the features and a reference feature;

the vision analysis server decodes the coded features for a vision analysis task.

16. The method according to claim 2, wherein the features are deep learning features extracted through a deep learning network.

17. The method according to claim 3, wherein the features are deep learning features extracted through a deep learning network.

18. The method according to claim 4, wherein the features are deep learning features extracted through a deep learning network.

19. The method according to claim 5, wherein the features are deep learning features extracted through a deep learning network.

20. The method according to claim 6, wherein the features are deep learning features extracted through a deep learning network.

* * * * *